(12) United States Patent
Kim

(10) Patent No.: US 7,356,326 B2
(45) Date of Patent: Apr. 8, 2008

(54) DIRECT-CONVERSION RECEIVER FOR REMOVING DC OFFSET

(75) Inventor: Seong-Joong Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 1104 days.

(21) Appl. No.: 10/020,332

(22) Filed: Dec. 12, 2001

(65) Prior Publication Data

US 2003/0109241 A1 Jun. 12, 2003

(51) Int. Cl.
*H04B 1/26* (2006.01)

(52) U.S. Cl. ............... 455/324; 455/296; 455/131

(58) Field of Classification Search ........... 455/324, 455/296, 131, 323, 339; 375/119, 346
See application file for complete search history.

(56) References Cited

U.S. PATENT DOCUMENTS

| | | | |
|---|---|---|---|
| 5,471,665 A | 11/1995 | Pace et al. | |
| 5,579,347 A | 11/1996 | Lindquist et al. | |
| 5,838,735 A | 11/1998 | Khullar | |
| 6,029,052 A | 2/2000 | Isberg et al. | |
| 6,029,058 A | 2/2000 | Namgoong et al. | |
| 6,175,728 B1 * | 1/2001 | Mitama | 455/323 |
| 6,192,225 B1 | 2/2001 | Arpaia et al. | |
| 6,225,848 B1 | 5/2001 | Tilley et al. | |
| 6,236,690 B1 | 5/2001 | Mimura et al. | |
| 6,252,438 B1 | 6/2001 | Sasaki | |
| 6,993,091 B2 * | 1/2006 | Ratto | 375/297 |
| 2002/0155822 A1 * | 10/2002 | Adachi | 455/293 |

FOREIGN PATENT DOCUMENTS

| | | | |
|---|---|---|---|
| EP | 863606 A1 * | 9/1998 | |
| EP | 0 948 128 | 10/1999 | |
| JP | 410247953 A * | 9/1998 | |
| WO | WO 98/38799 | 9/1998 | |

* cited by examiner

*Primary Examiner*—Melur Ramakrishnaiah
(74) *Attorney, Agent, or Firm*—The Farrell Law Firm, PC

(57) ABSTRACT

A direct-conversion receiver for a mobile communication system for substantially removing DC offset to recover an information signal from a carrier signal modulated by the information signal is disclosed.

6 Claims, 5 Drawing Sheets

DIRECT-CONVERSION RECEIVER FOR REMOVING DC OFFSET

BACKGROUND OF THE INVENTION

1. Field of the Invention

The present invention relates generally to a direct-conversion receiver for a mobile communication system. More particularly, the present invention is directed to a direct-conversion receiver for substantially removing DC offset to recover an information signal from a carrier signal modulated by the information signal.

2. Description of the Related Art

Mobile communication systems have evolved from simple one-way (i.e. paging system) communication systems to two-way communication systems comprising analog cellular systems and, more recently, digital cellular systems, e.g., the Global System for Mobile communications (GSM) or Code Division Multiple Access (CDMA). As the size and weight of the mobile communication terminal has been dramatically reduced, terminals that fit comfortably in the palm of one's hand and weighing less than seven ounces are commonplace. Nevertheless, previous receivers using the conventional (super) heterodyne type technology have limitations that restrict their ability to be made smaller and less expensive, because of such constructional elements as external filters, for example an IF SAW filter, and the like.

Therefore, research on alternative techniques to overcome such drawbacks has focused on a new type of receiver in which signals are demodulated and spectrally translated down to the base band directly by having the frequency of the receiver's local oscillator be the same as the frequency of the received carrier signal, which is called a Zero-IF receiver or homodyne receiver. In fact, the concept of direct-conversion had already been suggested by several radio pioneers in the 1920's, and even commercialized in the 1980's for the radio paging receiver. However, there are still several technical problems associated with a direct-conversion type receiver, such as I/Q mismatch, even-order distortion, flicker noise, local oscillator leakage, and DC offset, which make it difficult to replace the current (super) heterodyne type receiver. Fortunately, many of those problems have been solved thus far, with the exception of the DC offset component generated in the direct-conversion receiver.

In general, DC offset is a direct current component that is undesirably generated under several circumstances. The two major causes of the generation of DC offset will be explained with reference to FIGS. 1$a$ and 1$b$.

As shown FIG. 1$a$, since the isolation between local oscillator (LO) 106 and a band pass filter (BPF) 102 or a low noise amplifier (LNA) 103 is not perfect, a strong signal generated in LO 106 exists in BPF 102 or LNA 103, which is called a LO leakage signal. As a result, the LO leakage signal provided to a Quadrature Mixer 104 is multiplied with the LO signal generated in 106, so that both multiplied signals make a direct current component which is called a DC offset.

In the above mentioned case, the LO signal generated in local oscillator 106 and LO leakage signal are represented by the following equation, respectively.

$LO = A_{LO} \times COS w_{LO} t$ ($A_{LO}$ is the maximum amplitude and $w_{LO}$ corresponds to the carrier frequency $f_c$) (EQ. 1)

$LO$ leakage $= A_{leak} \times COS(w_{LO} t + \theta)$, where $\theta$ is phase delay caused by $LO$ leakage signal compared to $LO$ signal. (EQ. 2)

In this case, an output of the Quadrature Mixer 104 is modified as follows:

$LO \times LO$ leakage $= [A_{LO} \times COS(w_{LO} t)] \times [A_{leak} \times COS(w_{LO} t + \theta)] = \frac{1}{2} A_{LO} A_{leak} \times COS(2 w_{LO} t + \theta) + \frac{1}{2} A_{LO} A_{leak} \times COS\theta$ (EQ. 3)

Herein, $\frac{1}{2} A_{LO} A_{leak} \times COS\theta$ is represented as a direct current (DC) component which acts like noise after filtering in a low pass filter 105.

FIG. 1$b$ is another example to show how a DC offset component is generated. When a very strong interference (jammer) carrier having the same frequency but different amplitude and phase is provided to the Quadrature Mixer 104', it also affects a local oscillator 106' so that both signals coupled in the Mixer 104' generate a huge direct current (DC) component in the end of intermediate frequency (IF) range.

If the Jammer signal is an interference signal, it is given by the following expression:

$A_i \times COS w_i t$, where $A_i$ is the maximum amplitude and $w_i$ corresponds to the interferer frequency fi. (EQ. 4)

An interference signal, which is coupled into LO input of Quadrature Mixer 104', is expressed as set forth below:

$A_{ileak} \times (COS w_{ileak} t + \theta)$ (EQ. 5)

From the above both expressions, the output of the Quadrature Mixer 104' is represented by the following equation:

$[A_i \times COS w_i t] \times [A_{ileak} \times (COS w_{ileak} t + \theta)] = \frac{1}{2} A_i A_{ileak} \times COS(2 w_i t + \theta) + \frac{1}{2} A_i A_{ileak} \times COS\theta)$. (EQ. 6)

Hereinafter, several conventional technologies to cancel the DC offset component will be introduced.

FIG. 2 illustrates a conceptual architecture of the current direct-conversion receiver. However, the architecture showed in FIG. 2 cannot be used as a receiver in actual situations because it suffers from many problems, including the generation of DC offset component. Therefore, several added circuit components or devices have to be combined with the current direct-conversion receiver of FIG. 2 to avoid those problems. Three examples of the conventional direct-conversion receiver with the additional circuits/components will be explained with FIGS. 3, 4 and 5.

First, FIG. 3 illustrates the structure of a direct-conversion receiver having a capacitor 303 to remove the DC offset component. This kind of architecture has usually been recommended for use with a mobile terminal using the method of time division multiple access (TDMA).

According to FIG. 3, the DC offset component generated by the LO leakage signal is charged in a series capacitor 303 by connecting Switch 304 during the idle time slots, and then the charged DC voltage corresponding to the DC offset component is subtracted during Rx burst.

Next, FIG. 4 illustrates the structure of a direct-conversion receiver including high pass filter (HPF) with a low carrier frequency ($f_c$) to remove the DC offset component. This structure is pertinent to a full-duplex system operating in a broad frequency band. In this case, high pass filter 403 (HPF), which is located between low pass filter 402 (LPF) and low noise amplifier 404 (LNA), can remove not only the DC offset component, but also a DC signal with low frequency. However, if the broad frequency band is used in the system, the damage (i.e., cutting off the low frequencies) caused by HPF 403 would be weaker and weaker, and not affect the capability of the receiver.

Lastly, FIG. 5 illustrates the structure of a direct-conversion receiver using a digital signal processor (DSP) to remove a DC offset component. Referring to FIG. 5, a received signal is transformed into a digital signal in analog-to-digital converter 505 (ADC), and then averaged by digital signal processor (DSP) 507 to obtain a long-term averaging value. In other words, the DC offset component is estimated from the long-term average of the digital signal. The obtained digital value is provided to digital-to-analog converter 509 (DAC) through a memory 508, where the digital value is transformed into analog signal. In adder 503, the analog signal corresponding to the DC offset is subtracted off from the base band signal output from a mixer 502.

However, all three direct-conversion receivers mentioned in the above are only of limited use in a end-use product. That is, the direct-conversion receiver using a capacitor cannot be used with a full-duplex system, e.g. a CDMA communication system. In a TDMA system, interference can appear any time irrespective of the actual signal timing. This could make the receiver ineffective due to external interference. In the case of the direct-conversion receiver using a high pass filter (HPF), not only is the DC offset component removed, but also necessary signal components, such as the SNR (signal noise ratio), may be deteriorated. With the structure shown in FIG. 5, the DC component can be eliminated by averaging the digital signal for a long term in the DSP. Generally, however, this method of averaging a digital signal in real time also experiences problems when the DC offset component is suddenly increased due to the effects of external interference.

SUMMARY OF THE INVENTION

It is therefore an object of the present invention to provide a direct-conversion receiver for a mobile communication terminal that overcome the problems associated with known direct conversion receivers.

It is another object of the present invention to provide a direct-conversion receiver capable of canceling the DC offset component.

It is still another object of the present invention to provide a direct-conversion receiver designed to minimize the generation of DC offset.

It is still further another object of the present invention to provide a direct-conversion receiver with an amplifier having variable gain.

According to one aspect of the present invention, there is provided a direct-conversion receiver apparatus being able to cancel undesirable components. The apparatus comprises at least one mixer for mixing the signal provided from a low noise amplifier (LNA) with two I/Q components that are separated by 180° in phase; at least one low pass filter for eliminating spurious signals generated in the mixers; at least one compensation amplifier for compensating the DC offset signal, wherein a first amplifier has a fixed gain and a second has a variable gain; an amplifier for detecting the DC offset component; an analog-to-digital converter (ADC) for transforming an analog DC offset signal into a digital signal; a digital signal processor (DSP) for determining whether the DC offset is zero or not, and for outputting a pertinent control voltage of an automatic gain controller (AGC) to adjust the DC offset signal to zero; a digital-to-analog converter (DAC) for transforming an output of the DSP into an analog signal; and a compensation amplifier for amplifying signals provided from a subtracting means.

In another aspect of the present invention, there is provided a method for removing DC offsets in a direct-conversion receiver. The method comprises the steps of converting a mixed signal into a base band signal; amplifying the base band signal based upon a value generated by an adjusting means; outputting a value to minimize the difference; and amplifying signals provided from a subtracting means.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

A preferred embodiment of the present invention will be described in detail herein below with reference to the accompanying drawings. In the following description, numerous specific details are set forth to provide a more thorough understanding of the present invention. It will be apparent, however, to one skilled in the art that the present invention may be practiced without these specific details. In other instances, well known functions or constructions have not been described so as not to obscure the present invention.

Figure 1A:
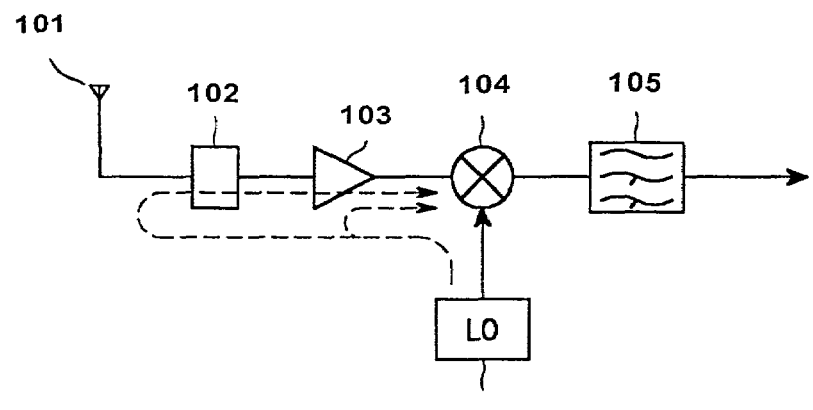
FIGS. 1a and 1b illustrate a prior art system which shows the process of how DC offset components are generated.
Figure 1B:
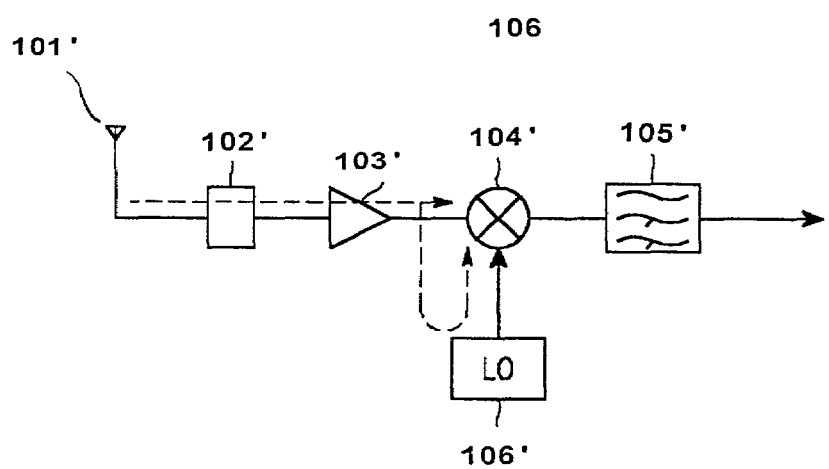
Figure 2:
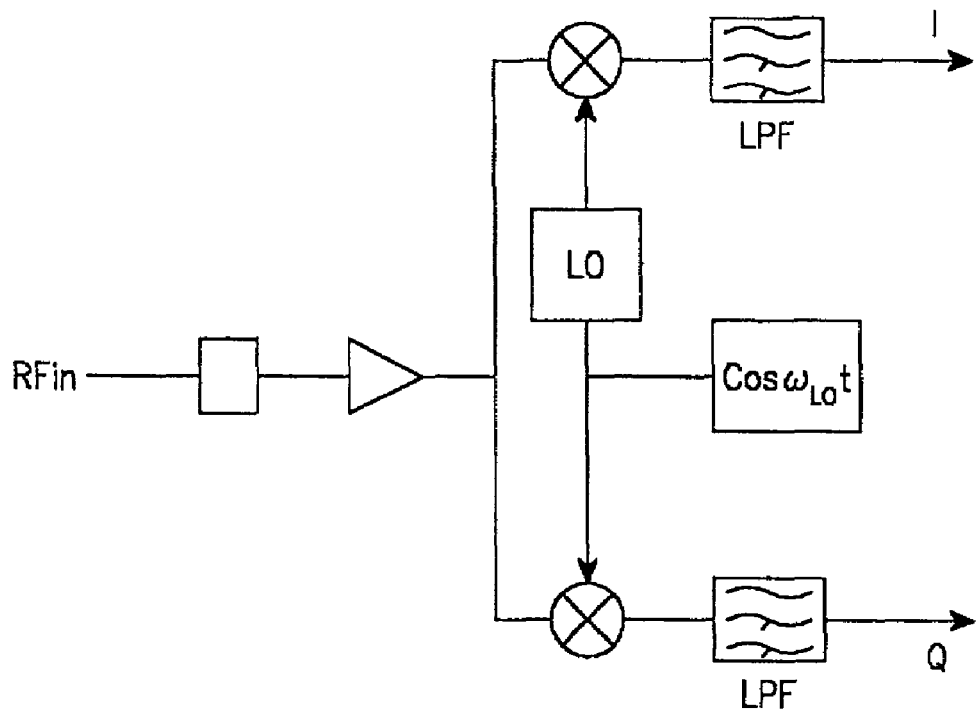
FIG. 2 illustrates a direct-conversion receiver according to the prior art.
Figure 3:
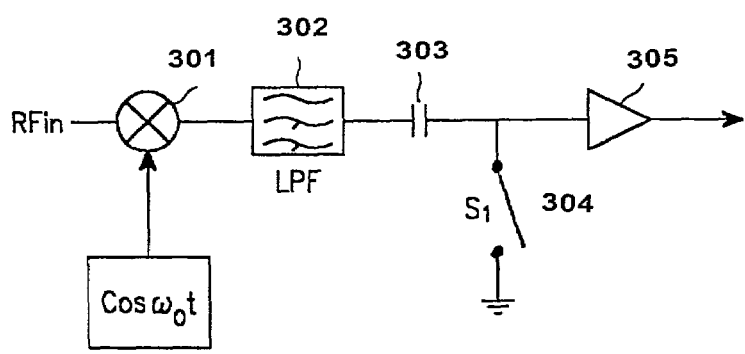
FIG. 3 illustrates a prior art structure of a direct-conversion receiver having a capacitor.
Figure 4:
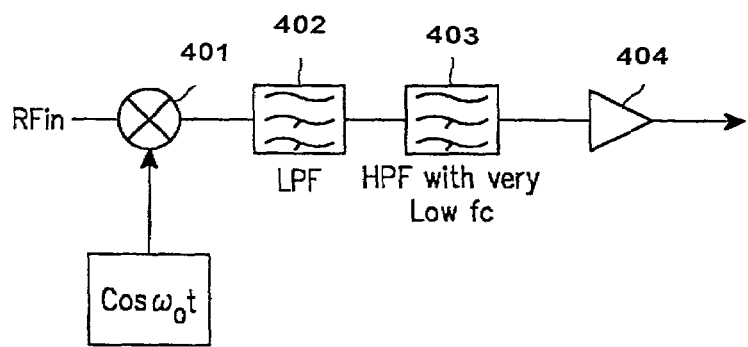
FIG. 4 illustrates a prior art structure of a direct-conversion receiver including a high pass filter with a low carrier frequency.
Figure 5:
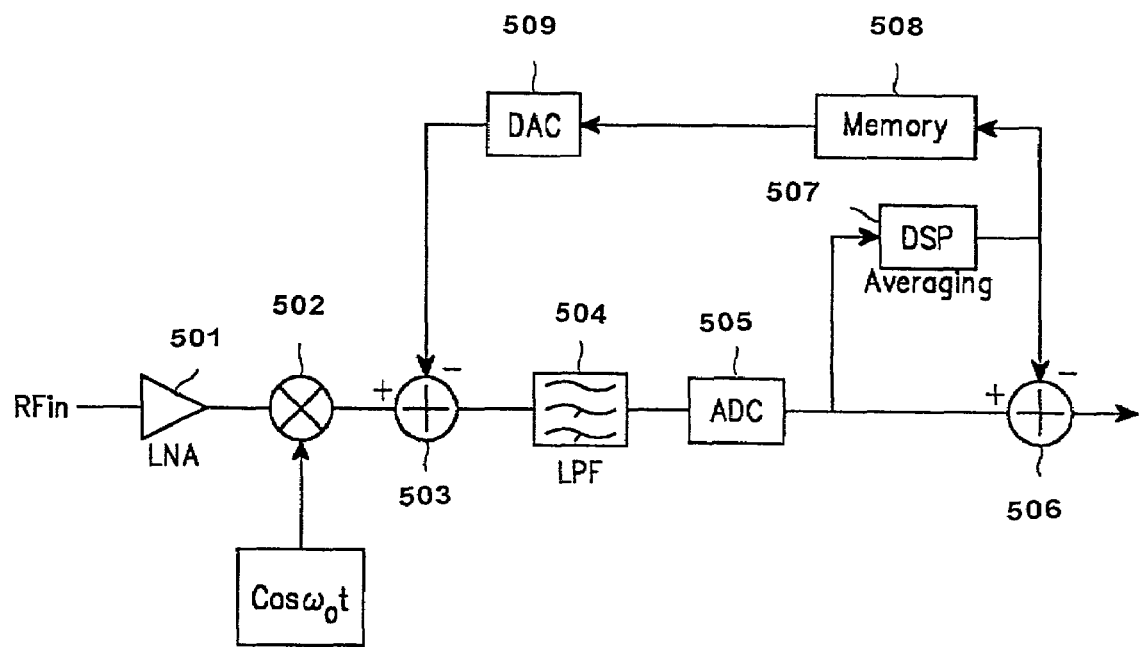
FIG. 5 illustrates a prior art structure of a direct-conversion receiver using a digital signal processor (DSP)
Figure 6:
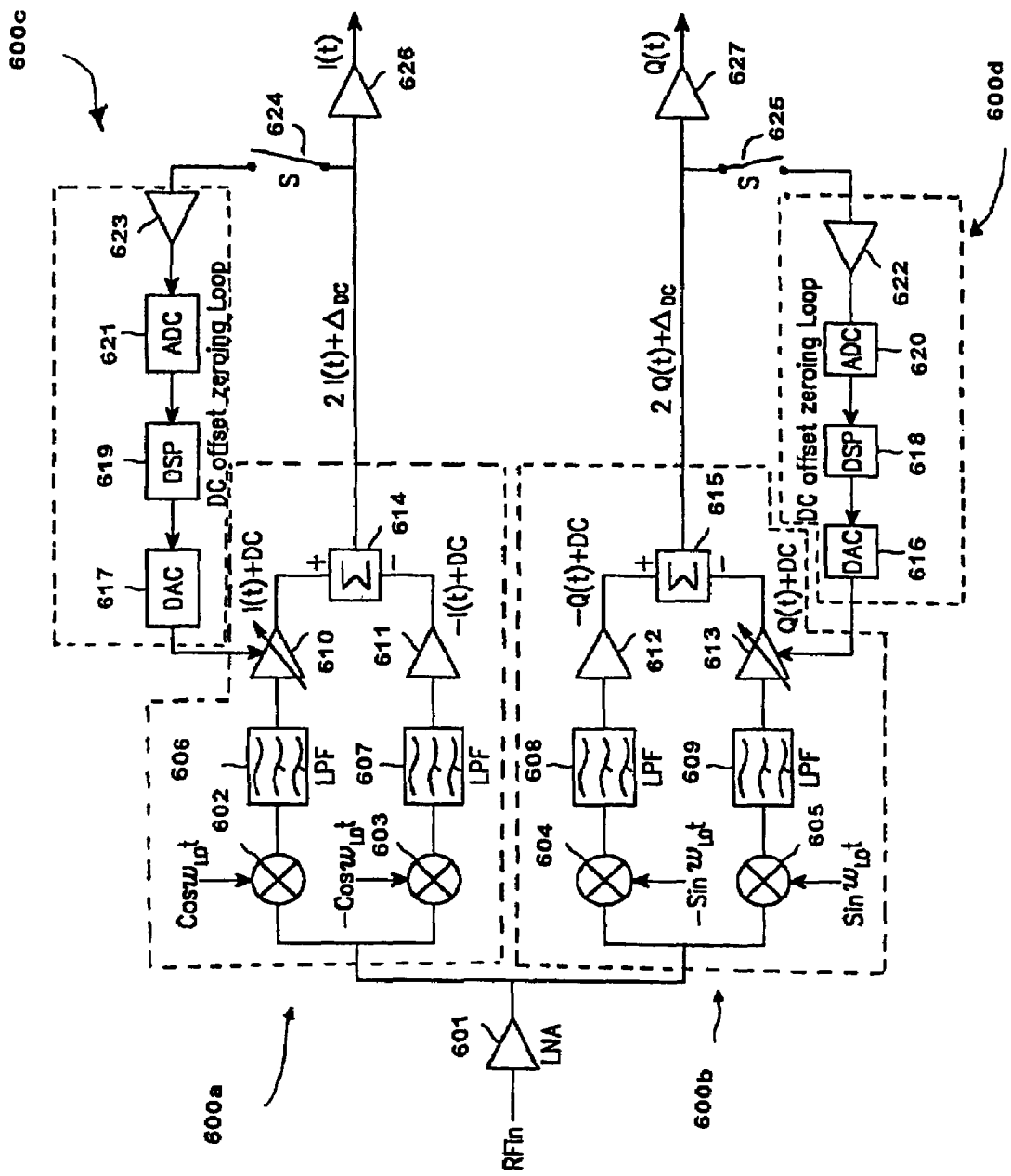
FIG. 6 illustrates a structure of a direct-conversion receiver according to the present invention.

FIG. 6 shows a block diagram of a direct-conversion receiver according to a preferred embodiment of the present invention, which preferably can be used in a mobile communication terminal. The receiver is comprised of a low noise amplifier 601 (LNA), two processing units 600a, 600b which serve as a converting means for down-converting a modulated signal received from an antenna, two feedback loop circuits 600c, 600d which serve as an adjusting means for adjusting a difference between two DC offsets. Herein, since each processing unit and feedback loop circuit is substantially identical, the processing unit 600a and feedback loop circuit 600c only will be explained.

The processing unit 600a includes two mixers 602 and 603 for mixing the signal provided from a low noise amplifier 601 (LNA) with two I components that are separated by 180° in phase, respectively. The processing unit 600a also includes low pass filters 606, 607 for eliminating spurious signals generated in the mixers, and two compensation amplifiers 610, 611 for compensating the DC offset signal, in which one amplifier has a fixed gain and the other is a variable amplifier. The advantage of this architecture using two mixers is that it is possible to obtain a complete information signal without any loss by combining two signals provided from each mixer 602, 603 in a subtracting means 614. However, it is only theoretically possible for two mixers to have the same characteristic with respect to the isolation between RF signals and signals generated by a local oscillator, and with respect to the factors that cause the DC offset component, e.g., external interference, local oscillator leakage, etc., which equally affect the two mixers. Therefore, the receiver also includes a feedback loop circuit 600c to substantially remove the DC offset component that is unavoidably generated.

The feedback loop circuit 600c includes a high gain amplifier 623 for detecting the DC offset component, an analog-to-digital converter (ADC) 621 for transforming an analog DC offset signal to a digital signal to enable a digital signal processor (DSP) 619 read the signal, the DSP 619 for determining whether the DC offset is zero or not and for outputting a pertinent control voltage to an automatic gain controller (AGC, not shown) to adjust the DC offset signal to be zero, and a digital-to-analog converter (DAC) 617 for transforming the output of the DSP into analog signal.

The direct-conversion receiver also includes two switches 624, 625 controlled by a central processor unit (not shown), to connect the processing unit to feedback loop circuit, and two amplifiers 626, 627 for amplifying signals provided from the subtracting means 614, 615, respectively.

As shown in FIG. 6, the preferred embodiment of the present invention is composed of two main parts. That is, one is a quadrature demodulator corresponding to the processing unit, the other is a DC offset zeroing loop which is also called a feedback loop circuit. In this case, each DC offset measured in amplifiers 610, 611 has the same amplitude but opposite sign, so it is substantially removed when two IF outputs are combined. This also applies to two DC offset at the outputs of amplifiers 612, 613.

The operation of the direct-conversion receiver 600 of FIG. 6 will be clearly understood with reference to the following mathematical analysis.

Generally, a carrier wave frequency of the received signal provided from LNA 601 is represented by the following equation.

$$S(t)=I(t)\text{COS } w_{LO}t+Q(t)\text{SIN } w_{LO}t \quad (\text{EQ. 7})$$

In this case, when the output signal of a local oscillator is defined as COS $w_{LO}t$, the output signal of the mixer 602 is represented by the following equations.

$$K \times [I(t)\text{COS}(w_{LO}t)+Q(t)\text{SIN}(w_{LO}t)] \times \text{COS}(w_{LO}t)=K \times I$$
$$(t), \text{ where K is the conversion constant of mixer.}$$

In addition, the mixer 602 also generates a DC offset component caused by LO leakage and external interference, and is represented as the following equation.

$$K \times [A_{LO} \times \text{COS}(w_{LO}t)] \times [A_{leak} \times \text{COS}(w_{LO}t+\theta)]=K \times [\tfrac{1}{2} \times A_{LO}A_{leak} \times \text{COS}(2w_{LO}t+\theta)+\tfrac{1}{2}A_{LO}A_{leak} \times \text{COS}\theta]$$
$$=\tfrac{1}{2} \times K[A_{LO}A_{leak} \times \text{COS}\theta] \quad (\text{EQ. 8})$$

$$K \times [A_i \times \text{COS}w_i t] \times [A_{ileak} \times (\text{COS}w_{ileak}t+\theta)]=K \times [\tfrac{1}{2}A_i\text{-}A_{ileak} \times \text{COS}(2w_i t+\theta)+\tfrac{1}{2}A_i A_{ileak} \times \text{COS}\theta]=\tfrac{1}{2} \times K$$
$$[A_i A_{ileak} \times \text{COS}\theta]. \quad (\text{EQ. 9})$$

In the case of the other mixer 603, since the input signal provided from a local oscillator is $-\text{COS } w_{LO}t$, the output signal of the mixer 603 is represented by the following equations.

$$K \times [I(t)\text{COS}(w_{LO}t)+Q(t)\text{SIN}(w_{LO}t)] \times -\text{COS}(w_{LO}t)=-K \times I(t)$$

As for similar reasons as set forth in the above, the output signal of the mixer 603 is represented by the following equation.

$$K \times [A_{LO} \times \text{COS}(w_{LO}t)] \times [A_{leak} \times \text{COS}(w_{LO}t+\theta)]=K \times [\tfrac{1}{2} \times A_{LO}A_{leak} \times \text{COS}(2w_{LO}t+\theta)+\tfrac{1}{2}A_{LO}A_{leak} \times \text{COS}\theta]$$
$$=\tfrac{1}{2} \times K[A_{LO}A_{leak} \times \text{COS}\theta] \quad (\text{EQ. 10})$$

$$K \times [A_i \times \text{COS}w_i t] \times [A_{ileak} \times (\text{COS}w_{ileak}t+\theta)]=K \times [\tfrac{1}{2}A_i\text{-}A_{ileak} \times \text{COS}(2w_i t+\theta)+\tfrac{1}{2}A_i A_{ileak} \times \text{COS}\theta]=\tfrac{1}{2} \times K$$
$$[A_i A_{ileak} \times \text{COS}\theta]. \quad (\text{EQ. 11})$$

Both DC offset components are represented the same according to the equations (9) and (11) because it is assumed that two mixers 602 and 603 have the same characteristics and the amount of leakage input to both mixers are equal. In this case, because the output of mixer 602 is I(t)+DC offset, and the output of mixer 603 is −I(t)+DC offset the output of subtractor 614 is 2I(t), which means that DC offset component is removed.

As same as the I path of processing unit 600a, in the Q path of the processing unit 600b a carrier wave frequency of the received signal provided from the LNA 601 is represented by the following equation.

$$S(t)=I(t)\text{COS } w_{LO}t+Q(t)\text{SIN } w_{LO}t \quad (\text{EQ. 7})$$

In this case, when the output signal of a local oscillator is defined as COS $w_{LO}t$, the output signal of the mixer 604 is represented by the following equations.

$$K \times [I(t)\text{COS}(w_{LO}t)+Q(t)\text{SIN}(w_{LO}t)] \times \text{SIN}(w_{LO}t)=K \times Q(t) \quad (\text{EQ. 12})$$

In addition, the mixer 604 also generates a DC offset component caused by LO leakage and external interference, and is represented as the following equation.

$$K \times [A_{LO} \times \text{COS}(w_{LO}t)] \times [A_{leak} \times \text{COS}(w_{LO}t+\theta)]=K \times [\tfrac{1}{2} \times A_{LO}A_{leak} \times \text{COS}(2w_{LO}t+\theta)+\tfrac{1}{2}A_{LO}A_{leak} \times \text{COS}\theta]$$
$$=\tfrac{1}{2} \times K[A_{LO}A_{leak} \times \text{COS}\theta] \quad (\text{EQ. 13})$$

$$K \times [A_i \times \text{COS}w_i t] \times [A_{ileak} \times (\text{COS}w_{ileak}t+\theta)]=K \times [\tfrac{1}{2}A_i\text{-}A_{ileak} \times \text{COS}(2w_i t+\theta)+\tfrac{1}{2}A_i A_{ileak} \times \text{COS}\theta]=\tfrac{1}{2} \times K$$
$$[A_i A_{ileak} \times \text{COS}\theta]. \quad (\text{EQ. 14})$$

In the case of the other mixer 605, since the input signal provided from a local oscillator is $-\text{COS } w_{LO}t$, the output signal of the mixer 605 is represented by the following equations.

$$K \times [I(t)\text{COS}(w_{LO}t)+Q(t)\text{SIN}(w_{LO}t)]x-\text{SIN}(w_{LO}t)=-K \times Q(t) \quad (\text{EQ. 15})$$

For similar reasons as set forth in the above, the output signal of the mixer 605 is represented by the following equation.

$$K \times [A_{LO} \times (-\text{SIN}(w_{LO}t)] \times [A_{leak} \times (-\text{SIN}(w_{LO}t+\theta)]=K \times [-\tfrac{1}{2}A_{LO}A_{leak} \times \text{COS}(2w_{LO}t+\theta)+\tfrac{1}{2}A_{LO}A_{leak} \times \text{COS}\theta]$$
$$=\tfrac{1}{2} K \times [A_i A_{ileak} \times \text{COS}\theta] \quad (\text{EQ. 13})$$

$$[A_i \times \text{SIN}w_i t] \times [A_{ileak} \times \text{SIN}(w_{ileak}t+\theta)]=K \times [-\tfrac{1}{2}A_i\text{-}A_{ileak}t+\theta)]=\tfrac{1}{2} \times K[A_i A_{ileak} \times \text{COS}\theta] \quad (\text{EQ. 16})$$

Both DC offset component are represented the same according to the equations (13) and (16) because it is assumed that two mixers 604 and 605 have the same characteristics and the amount of leakage input to both mixers are equal. In this case, because the output of mixer 604 is Q(t)+DC offset, and the output of mixer 605 is −Q(t)+DC offset the output of subtractor 615 is 2Q(t), which means that DC offset component is removed.

While it is possible theoretically for the DC offset to be completely removed, the DC offset output from each amplifier 610, 611 is not same in practice, because of the difference of DC offset generated in the two mixers 602, 603. Therefore, the output of the subtracting means still includes a small DC offset component.

In order to overcome the above drawbacks, the preferred embodiment of the present invention includes the DC offset Zeroing Loop circuit 600c. Herein, the output of the DC offset Zeroing Loop circuit 600c is provided to one of two amplifiers 610, 611 to control the gain, whereas, the other of the two amplifiers 610, 611 has fixed gain. It is fixed in order to keep the electrical delay of the two paths the same. In other words, the one amplifier having a variable or controlled gain is adjusted to minimize the DC offset difference if a DC offset is detected. In this case, it is assumed that the DC offset is generated by only LO leakage. Therefore, since the process of removing DC offset is implemented only in cases of the existence of LO leakage, the gain value of the gain controllable amplifier 610 or 611 is determined during manufacturing a mobile telephone or could be determined whenever the mobile telephone is turned on. Once the gain value is determined, it is continuously used as the gain value of the mixers.

In fact, DC offset can be generated in different ways. Nevertheless, although the gain value of the amplifier is determined when only LO leakage exists in the above preferred embodiment, the effectiveness of DC offset zeroing of this invention is applied to other receivers that generate DC offset caused by factor other than interference or LO leakage because DC offset caused by any interference is generated through the same algorithm as the DC offset caused by LO leakage.

The above description of the preferred embodiment is provided to enable any person skilled in the art to make or use the present invention. Various modifications to the preferred embodiments will be readily apparent to those skilled in the art, and the generic principles defined herein may be applied to other embodiments. Thus, the present invention is not intended to be limited to the embodiment shown but is to be defined by the scope and spirit of the appended claims.

What is claimed is:

1. A direct-conversion receiver for substantially removing DC offset signals in a mobile communication terminal, the receiver comprising:
    converting means for down converting a modulated signal received from an antenna;
    detecting means for detecting a difference between two DC offset signal components; and
    adjusting means for substantially reducing the difference by determining whether the DC offset is zero and outputting a control voltage to adjust the DC offset signal to zero, comprising:
        an amplifier for increasing a magnitude of the DC offset component;
        an analog-to-digital converter (ADC) for transforming an analog DC offset signal into a digital signal;
        a digital signal processor (DSP) for determining whether the DC offset is zero or not, and for outputting a control voltage to an automatic gain controller to adjust the DC offset signal to zero; and
        a digital-to-analog converter (DAC) for transforming an output of the DSP into an analog signal.

2. The receiver as claimed in claim 1, wherein the converting means comprises:
    at least one mixer for mixing the signal provided from a low amplifier (LNA) with two I/Q components that are separated by 180° in phase;
    at least one low pass filter for eliminating spurious signals generated in the mixers; and
    at least one compensation amplifier for compensating the DC offset signal, wherein a first amplifier has a fixed gain and a second amplifier has a variable gain.

3. The receiver as claimed in claim 1, further comprising:
    a switching means for connecting the converting means to a detecting means; and
    at least one amplifier for amplifying signals provided from a subtracting means.

4. A method for substantially removing DC offset signals utilizing a direct-conversion receiver, the method comprising the steps of:
    down-converting a modulated signal receiver from an antenna;
    detecting a difference between the DC offset signal components from balanced mixers; and
    adjusting the difference between detected DC offset signal components to minimize the difference, comprising:
        increasing the magnitude of the DC offset component;
        transforming an analog DC offset signal into a digital signal;
        determining whether the DC offset is zero or not, and outputting a control voltage to adjust the DC offset signal to zero; and
        transforming the adjusted DC offset signal into an analog signal.

5. The method as claimed in claim 4, wherein the adjusting step includes the step of:
    outputting a value to minimize the difference.

6. The method as claimed in claim 4, wherein the down-converting step includes the steps of:
    mixing a signal provided from a low noise amplifier with two I/Q components generated in a local oscillator, respectively;
    converting the mixed signal into a base band signal; and
    amplifying the base band signal based upon a value generated by an adjustment means of the direct conversion receiver.

* * * * *